United States Patent
Lian et al.

(10) Patent No.: US 12,184,239 B2
(45) Date of Patent: Dec. 31, 2024

(54) METHOD TO REDUCE NOISE IN MICROPHONE CIRCUITS

(71) Applicant: Creative Technology Ltd, Singapore (SG)

(72) Inventors: Yam Fei Lian, Singapore (SG); Siew Ling Loke, Singapore (SG)

(73) Assignee: Creative Technology Ltd, Singapore (SG)

( * ) Notice: Subject to any disclaimer, the term of this patent is extended or adjusted under 35 U.S.C. 154(b) by 184 days.

(21) Appl. No.: 17/625,074

(22) PCT Filed: Jul. 7, 2020

(86) PCT No.: PCT/SG2020/050388
§ 371 (c)(1),
(2) Date: Jan. 5, 2022

(87) PCT Pub. No.: WO2021/006816
PCT Pub. Date: Jan. 14, 2021

(65) Prior Publication Data
US 2022/0271717 A1    Aug. 25, 2022

Related U.S. Application Data

(60) Provisional application No. 62/871,654, filed on Jul. 8, 2019.

(51) Int. Cl.
*H03F 1/26* (2006.01)
*H03F 3/183* (2006.01)
*H04R 3/00* (2006.01)

(52) U.S. Cl.
CPC .............. *H03F 1/26* (2013.01); *H03F 3/183* (2013.01); *H04R 3/00* (2013.01); *H03F 2200/03* (2013.01);
(Continued)

(58) Field of Classification Search
CPC ........ H03F 1/26; H03F 3/183; H03F 2200/03; H03F 2200/372; H03F 2200/459;
(Continued)

(56) References Cited

U.S. PATENT DOCUMENTS 5,751,823 A    5/1998   Strickland et al.
6,490,177 B1 * 12/2002  Figueroa ............... H02M 3/335
                                                363/131
(Continued)

FOREIGN PATENT DOCUMENTS

EP          1553795 A1      7/2005

OTHER PUBLICATIONS

IPOS, Singapore Written Opinion dated Apr. 26, 2023 in Application No. 11202113044W.
(Continued)

*Primary Examiner* — Carolyn R Edwards
*Assistant Examiner* — Friedrich Fahnert
(74) *Attorney, Agent, or Firm* — SNELL & WILMER L.L.P.

(57) ABSTRACT

A computer sound card includes a power supply noise isolation circuit for reducing ground plane noise generated during application of heavy electrical loads to the power supply, such as loads presented by computer GPUs. The power supply isolation circuit isolates the output ground from the ground presented from the power supply to the isolation circuit input. The isolation circuit in one embodiment includes switching circuitry and a transformer to reduce the power supply ripple noise that might otherwise be introduced by the power supply into an amplifier such as a microphone preamp. In some embodiments a differential amplifier stage is added to the output of the microphone preamp stage to further reduce noise, such as common mode noise.

18 Claims, 4 Drawing Sheets

(52) U.S. Cl.
CPC .. *H03F 2200/372* (2013.01); *H03F 2200/459* (2013.01); *H04R 2410/03* (2013.01)

(58) Field of Classification Search
CPC ..... H03F 3/181; H03F 2200/189; H04R 3/00; H04R 2410/03; H04R 2410/00; G06F 3/162; H02M 1/123; H02M 1/15; H02M 3/33507; H02M 1/12
USPC ....................................................... 381/94.1
See application file for complete search history.

(56) References Cited

U.S. PATENT DOCUMENTS

| | | | | |
|---|---|---|---|---|
| 10,069,400 | B1 * | 9/2018 | Morgan, Jr. | ........ H02M 3/3376 |
| 10,540,139 | B1 * | 1/2020 | Janes | ........................ H04R 3/04 |
| 10,805,740 | B1 * | 10/2020 | Snyder | ................. H04R 25/407 |
| 2005/0242874 | A1 | 11/2005 | Lind | |
| 2008/0123874 | A1 * | 5/2008 | Chiu | ......................... G06F 3/16 |
| | | | | 381/120 |
| 2010/0322440 | A1 | 12/2010 | Chiu et al. | |
| 2014/0153746 | A1 * | 6/2014 | Nicollini | ................. H03F 3/005 |
| | | | | 381/120 |
| 2014/0355312 | A1 * | 12/2014 | Zhang | ............... H02M 3/33592 |
| | | | | 363/21.01 |
| 2015/0358719 | A1 * | 12/2015 | Mackay | .............. G06F 11/3041 |
| | | | | 381/384 |
| 2016/0150325 | A1 * | 5/2016 | Oliaei | .................... H04R 3/005 |
| | | | | 381/111 |
| 2019/0312556 | A1 * | 10/2019 | Bellingham | ............ H03F 3/181 |

OTHER PUBLICATIONS

TIPO, Taiwan Office Action and Search Report dated Sep. 15, 2023 in Application No. 109122578.
TIPO, Taiwan Office Action dated Mar. 18, 2024 in Application No. 109122578.
TIPO, Taiwan Notice of Allowance dated Jun. 28, 2024 in Application No. 109122578.
IPOS, Singapore Written Opinion dated Apr. 29, 2024 in Application No. 11202113044W.
EPO; European Search Report dated Aug. 5, 2024 in Application No. 20740440.1.
Gaggl et al: "Readout circuits for silicon microphones", 2015 International Symposium on Vlsi Technology, Systems and Applications, IEEE, Apr. 27, 2015 (Apr. 27, 2015), pp. 1-2, xp032782084, DOI: 10.1109/vlsi-tsa.2015.7117598.
Bigelow, "How to Eliminate Ground Loops with Signal Isolation", https://www.allaboutcircuits.com/projects/how-to-eliminate-ground-loops-with-signal-isolation/, retrieved from the internet, Jan. 29, 2016, pp. 1-6, XP093191354.
ISA; International Search Report and Written Opinion dated Jan. 14, 2021 in PCT/SG2020/050388.
ISA; International Preliminary Report on Patentability dated Jan. 11, 2022 in PCT/SG2020/050388.

* cited by examiner

When Graphics card is not running at load

Without Cleanline Technology

With Cleanline Technology

FIG. 3

Without Cleanline Technology

With Cleanline Technology

FIG. 4

When Graphics card is running at load

METHOD TO REDUCE NOISE IN MICROPHONE CIRCUITS

CROSS REFERENCES TO RELATED APPLICATIONS

This application is a National Stage (§ 371) of International Application No. PCT/SG2020/050388, filed 7 Jul. 2020 and entitled "METHOD TO REDUCE NOISE IN MICROPHONE CIRCUITS", which claims the benefit of U.S. Provisional Application No. 62/871,654, filed 8 Jul. 2019 and entitled "METHOD TO REDUCE NOISE IN MICROPHONE CIRCUITS", the disclosure of which is herein incorporated by reference in its entirety.

BACKGROUND OF THE INVENTION

1. Field of the Invention

The present invention relates to computing devices with input/output circuitry. More particularly, the present invention relates to power supply noise control in audio processing circuitry such as sound cards for computing devices.

2. Description of the Related Art

Over time the importance of graphics cards and chips with respect to computing devices has increased. To meet these increased demands, graphics chip and card manufacturers have provided on at least an annual basis new generations of graphics hardware exhibiting increased performance. With this overall increase in performance power demands have likewise increased. To meet this increased demand for power, computer manufacturers have provided external power connectors due at least in part to the insufficient power available from motherboard busses, such as the PCI/e busses.

With these high end graphics cards consumers have also developed high expectations for the audio performance. Unfortunately, the higher power consumption of these high performance graphics cards also comes with increased power supply noise. Consumers use audio in conjunction with high performance graphics cards in many situations. One example includes online interactive gaming where audio may be used to communicate with other players in a multi-player setting. In another example, a consumer may want to provide a commentary to a streamed video of his game competition, for example in using services such as "Twitch". In these and other cases clear voice communications are important.

Microphone amplifiers and preamplifiers used to provide the voice communications have a very high gain, for example gains of 20-40 dB. Any noise introduced by the power supply will be amplified by the microphone amplifier as well. The typical solutions include more power supply filters, use of amplifiers with high Power Supply Rejection Ratio (PSRR) characteristics, and better ground planes to name a few. But given the high gains used in the microphone amplifiers for voice communications, these solutions are often insufficient to reduce the noise to a level acceptable for a high-end product. What is needed is a way to reduce this power supply noise so that very weak microphone signals can undergo high amplification and still provide clear voice communication signals at the amplifier outputs.

SUMMARY OF THE INVENTION

To achieve the foregoing, the present invention provides in various embodiments an audio processing system for use with a computing device such as a laptop computer or a smart phone or a desktop computer. The system includes an isolation block configured to receive a supply signal comprising a positive voltage and a first ground reference, the isolation block configured to reduce power supply noise present in the supply signal by providing at its output a positive output voltage and second ground reference, the second ground reference isolated from the first ground reference. The audio processing system further includes a microphone preamp circuit configured with one input receiving a microphone signal, a second input at the second ground reference, and an output signal. A digital signal processor block is further included and is configured to receive the microphone preamp output signal, convert it to a digital format, and to transmit the digitized microphone preamp output signal to the computing device. In one embodiment the isolation block includes switching circuitry and a transformer. In this application, the transformer functions to isolate the power supply ground from other system grounds and providing an isolated low noise power supply.

In yet another embodiment the audio processing system further includes a differential amplifier connected between the microphone preamp and the digital signal processor block. The differential amplifier is configured to remove common mode noise from the microphone preamp output signal.

DETAILED DESCRIPTION OF PREFERRED EMBODIMENTS

Reference will now be made in detail to preferred embodiments of the invention. Examples of the preferred embodiments are illustrated in the accompanying drawings. While the invention will be described in conjunction with these preferred embodiments, it will be understood that it is not intended to limit the invention to such preferred embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known mechanisms have not been described in detail in order not to unnecessarily obscure the present invention.

It should be noted herein that throughout the various drawings like numerals refer to like parts. The various drawings illustrated and described herein are used to illustrate various features of the invention. To the extent that a particular feature is illustrated in one drawing and not another, except where otherwise indicated or where the structure inherently prohibits incorporation of the feature, it is to be understood that those features may be adapted to be included in the embodiments represented in the other figures, as if they were fully illustrated in those figures. Unless otherwise indicated, the drawings are not necessarily to scale. Any dimensions provided on the drawings are not intended to be limiting as to the scope of the invention but merely illustrative.

The greater use of external power connectors provided by computer power supplies instead of the power available from computer bus sources such as the PCIe bus has led to increased noise concerns. The PCIe bus is a highspeed serial computer expansion bus standard. It commonly serves as the motherboard interface for computer graphics cards, hard drives, and Wi-Fi hardware modules, among others. The noise introduced by the power supply can generally be described as power supply voltage ripple. It is defined as an unwanted AC voltage superimposed on the output rails of power supplies. The ripple is mainly caused by the loading on the power supply. This "loading" in one common example is from the graphics card that draws current in a non-constant manner, for example when rendering a complex scene from frame to frame. This non-constant loading causes the current drawn to be varying. The varying current manifests itself as ripple voltage due to resistance on the power supply wires (which is not zero ohm), even when a ground plane is used. This can also be due to power surges and dips when devices connected to the same power rail are powered up or shut down.

Figure 1:
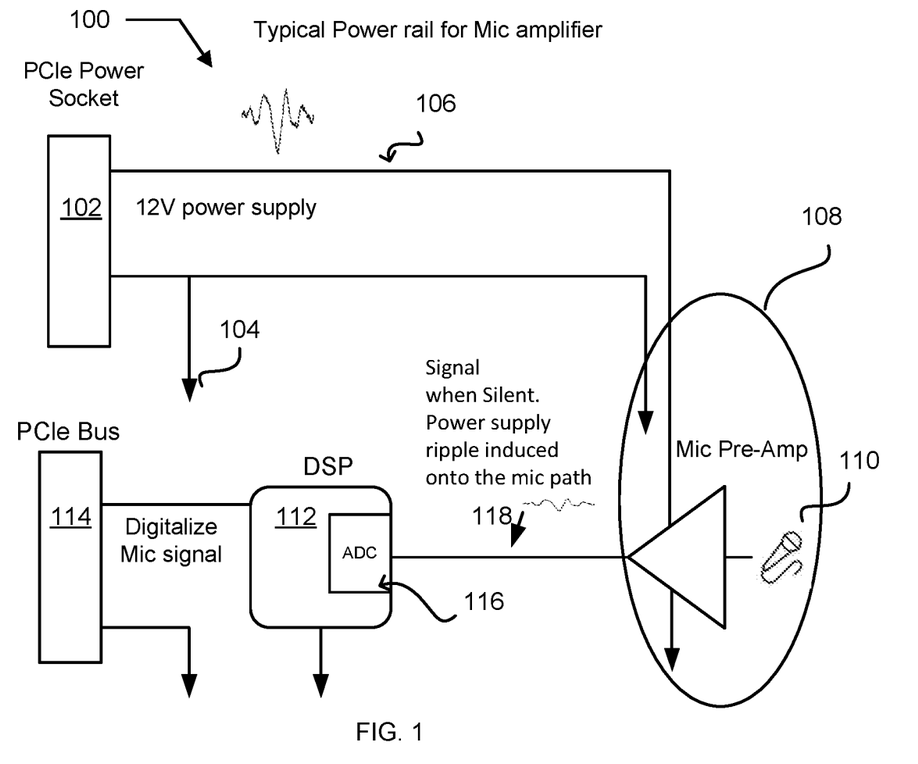
FIG. 1 is a diagram illustrating a conventional microphone amplifier for use with computers.
Figure 2:
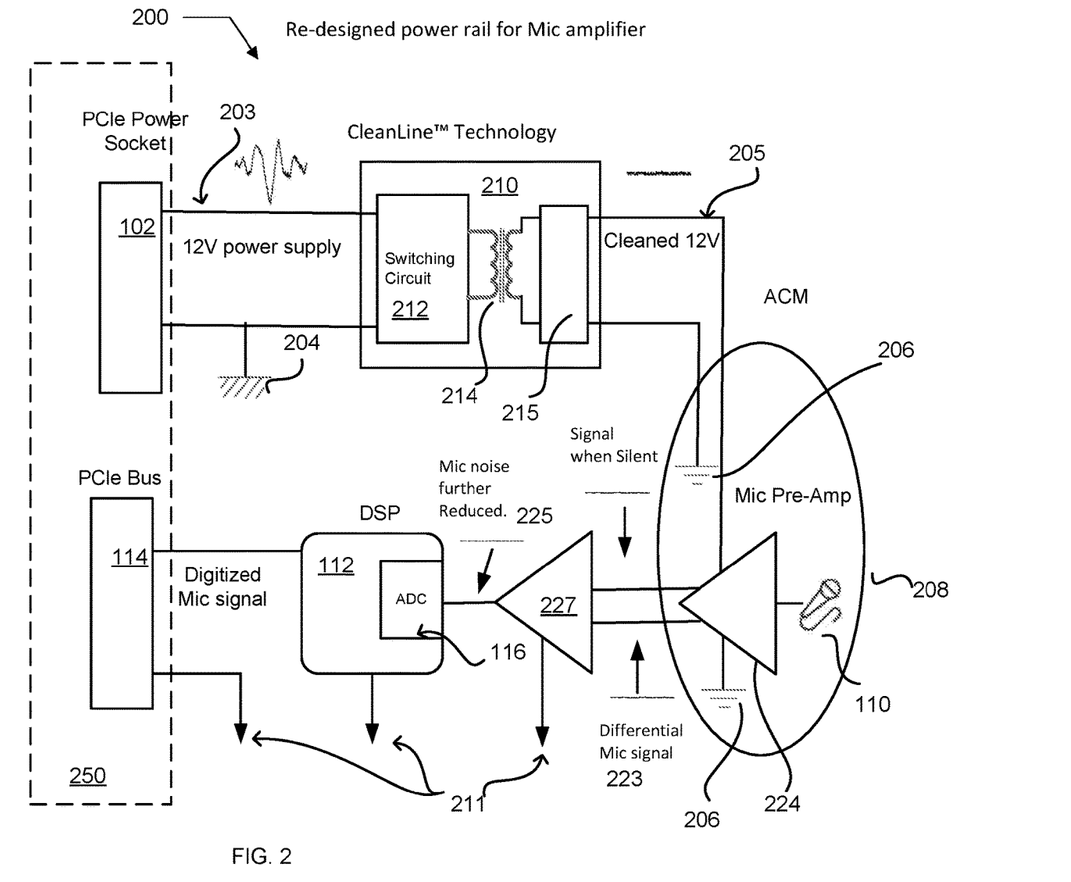
FIG. 2 is a block diagram illustrating a microphone amplifier circuit having noise isolation circuitry for use with computing devices in accordance with embodiments of the present invention.

To minimize the voltage ripple noise and to prevent its amplification by the microphone preamplifier and/or differential amplifier stages, isolation circuits are introduced between the power supply and the microphone preamp/amp. For comparison a conventional microphone amplifier with a typical power rail is illustrated in FIG. 1 whereas a modified circuit illustrating one embodiment of the present invention is shown in FIG. 2. That is, FIG. 1 is a diagram illustrating a conventional microphone amplifier 100 for use with computers. FIG. 2 is a block diagram illustrating a microphone amplifier circuit having noise isolation circuitry for use with computing devices in accordance with embodiments of the present invention.

The typical power rail shown in FIG. 1 derives its power from a power supply connector such as PCIe power socket 102. The positive supply signal 106 is shown exhibiting considerable ripple noise. In the conventional case of FIG. 1 the negative power supply rail 104 is a common ground for power socket 102, the microphone preamp 108, digital signal processor 112, and the computer bus (e.g., PCIe bus) 114. While it is desirable to introduce a clean voice communication signal to DSP 112 for generating a digitized microphone signal for use by the computing device (e.g., computer), the power supply ripple noise here is problematic. Due to the high amplification provided to the signal from the microphone 110, distortion will occur. This is believed to be symptomatic of grounds that are connected together (i.e., "Common" grounds). In these circuits, non-constant loading on the power supply rails will cause voltage ripple to appear on the "grounds" at different points on the circuit boards: i.e. the ground of the Mic pre-amp and the ground of the ADC on the sound card will have some voltage differences. These voltage differences manifest themselves as noise and will be coupled together with the Mic signal, amplified by the microphone preamp/amplifier and sent over to the ADC.

When an isolated power supply as disclosed in embodiments of the present invention is used, the ground of the Mic pre-amp is isolated from the main power supply, and hence does not have the voltage difference caused by the non-constant load. This allows low noise isolated power to be provided to microphone circuitry for voice communications.

FIG. 2 shows the redesigned power rails for a sound card or audio amplification system 200 to produce low noise isolated power to prevent distortion from the amplification of noise in the microphone path, i.e., the microphone amplifier circuitry. It should be noted that for illustration purposes the electrical connections shown correspond to a sound card inserted in a desktop computer but the features of the present invention are equally applicable to other environments where power supply ripple voltages present problematic noise issues. That is, the features of the present invention are equally applicable to notebook/laptop computers, smart phones, and generally any circuit where reduction of power supply ripple is necessary prior to generation of clean output signals. The invention embodiments are well suited to providing clean amplified voice signals, such as those necessary for digitizing by an analog to digital converter (ADC) for further audio processing.

As is shown in FIG. 2, PCIe power socket 102 supplies power to the microphone audio amplification circuits. Typically, the computer power supply provides power to the computer mother board so that individual slots or busses are powered. In the case of the PCI Express standard, a main power connector provides power for devices such as video cards up to a limit (75 watts maximum for one version) through the PCIe x16 slot. But this standard also defines an auxiliary power connector (such as a PCI Express power connector configured for connecting to power socket 102) capable of delivering additional power to a graphics card directly from the power supply. One primary aim of this feature is accommodating high performance graphics cards. The auxiliary power 203 made available from computing device 250 is typically at 12V and is "noisy" for the reasons detailed elsewhere in the specification. The power made available through auxiliary power connectors may be at other voltages, including but not limited to 5V.

Rather than applying this noisy power directly to microphone preamp circuit 208, an isolation circuit 210 is interposed. This isolates the ground 206 of the microphone preamp from the ground 204 of the power supply, resulting in an isolated low noise power supply and thus providing a "clean" (12V in this case) voltage 205 that is applied to the pre-amp 208.

In a preferred embodiment the isolation circuit 210 includes a switching circuit 212, a transformer 214, and a rectifier block 215. In one embodiment, the switching circuit and transformer 214 are connected in a push pull configuration. In this embodiment the switching circuit includes a controlling IC to adjust the switching frequency and the duty cycle, the latter value to control the voltage. In one embodiment the switching circuitry is in a push-pull configuration, for example, a pair of switches operating out of phase to generate an AC voltage on the primary side of a transformer.

This AC voltage is coupled to the secondary side of the transformer, and rectified to a DC voltage.

Figure 5:
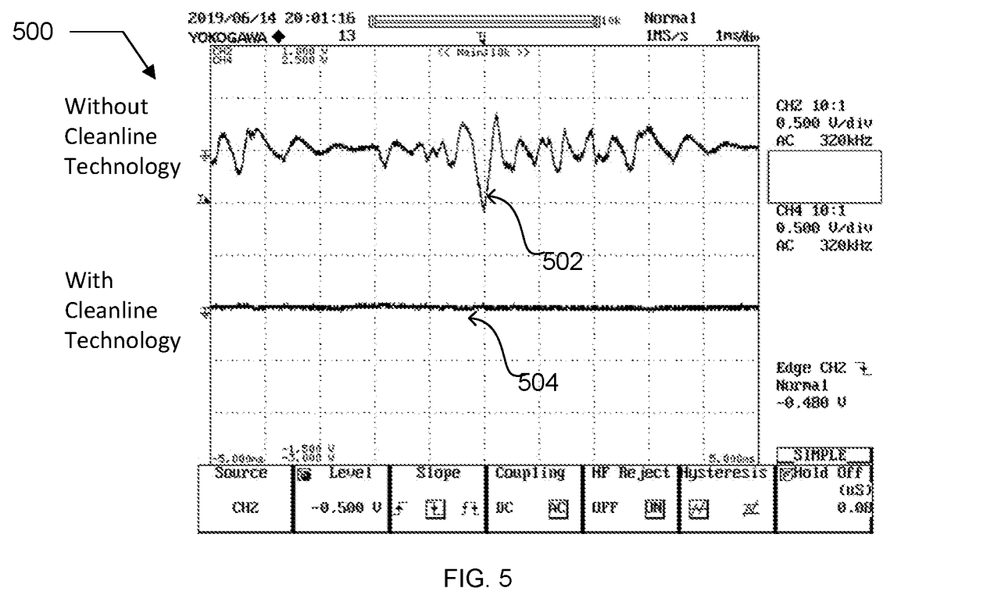
FIG. 5 is a diagram illustrating sample power supply noise reductions in the presence of heavily loaded graphics cards in accordance with some embodiments of the present invention.
Figure 6:
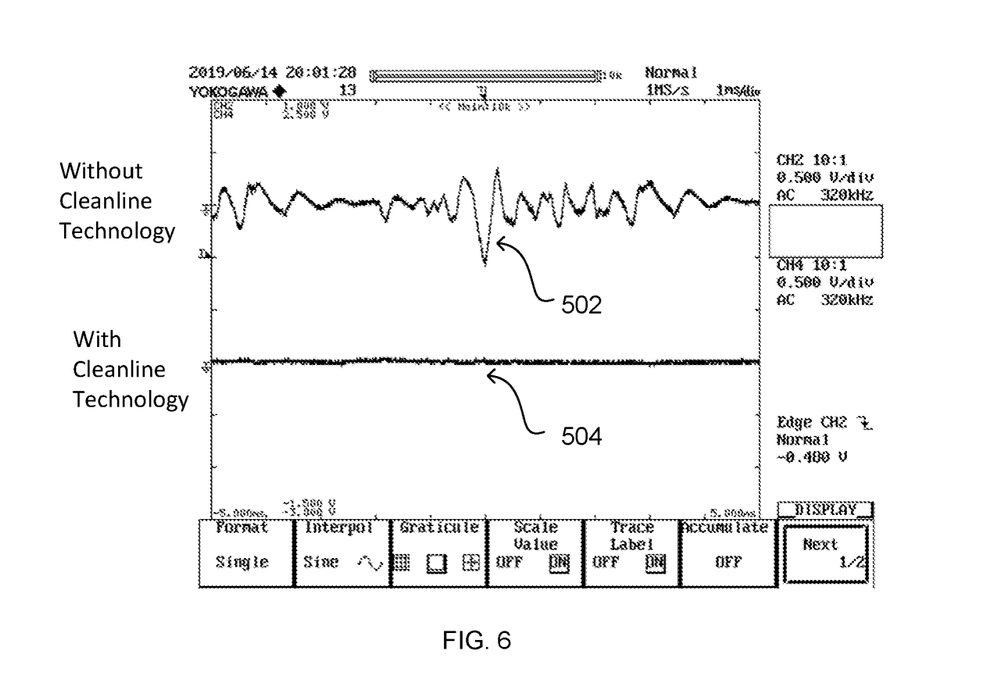
FIG. 6 is a diagram illustrating another view of sample power supply noise reductions in the presence of heavily loaded graphics cards in accordance with some embodiments of the present invention.

In the preferred embodiments, the switching circuitry and push-pull configuration are not used to change the nominal value of the power supply voltage from that applied to the input of the isolation circuit 210 but rather to isolate the microphone preamp power supply 205 and ground 206 from the input power supply 203 and ground 204. This produces low noise isolated power and reduces the amount of distortion in the microphone signal output from the microphone preamp 208. The noise attenuation improvements from the isolation block are illustrated in FIGS. 5 and 6, which show the improvement when the graphics card is running at load, for example at the differential microphone signal 223 at the output of the preamp 208. In the switching circuitry high switching frequency design generally leads to smaller transformers and lower output ripple and for those reasons is preferred in one embodiment of the invention.

In a preferred design the switching circuitry controls a transformer with separate primary and secondary windings to enable the isolation from input to output. In this embodiment the Switching IC converts the 12V DC to AC, then couples over to the secondary winding of the transformer then rectified back to 12V DC. The switching circuitry can be fine-tuned, for example by selection of L and C values, to reduce any potential switching noise in the audio band or its harmonics. For a non-limiting example, in one embodiment the switching frequencies are selected to be above 500 Khz.

Microphone preamp 208 preferably is a high gain amplifier capable of amplifying weak voice signals. The amplifier gain is preferably in the range of 20-43 dB or higher. It is shown including op amp 224 with a single input but can include other amplifier configurations. In some embodiments a differential amplifier 227 is added to the output of the microphone preamp for additional noise control. In the case of microphone preamp 206 an op amp can be used (but isn't required) to amplify the microphone signal. FIG. 2 shows only one of the operational amplifiers inputs to connect to the amplifier, using either the "inverting" or the "non-inverting" input terminal to amplify a single input signal with the other input being connected to ground. Since a standard operational amplifier has two inputs, inverting and non-inverting, we can also connect microphone signals to both of these inputs at the same time producing another common type of operational amplifier circuit called a Differential Amplifier. The resultant output voltage will be proportional to the "Difference" between the two input voltage signals and works well to reduce common mode noise.

In particular, differential amplifier 227 takes the differential microphone signals 223 from the microphone preamp 208 and due to the nature of differential amplification reduces common mode noise, resulting in further microphone noise reduction reflected at the Differential Amp output signal 225. It should be noted that although FIG. 2 shows the amplifier 227 with 2 inputs, other embodiments of the invention are constructed with the amplifier 227 acting as a second stage of amplification but having only a single input. The mic itself may be single ended but differential mic signals can be achieved by changing the manner in which the mic or opamp is connected. This clean signal is then applied to the Analog to Digital Converter block 116 of DSP 112, resulting in a clean digitized microphone signal applied to the computer bus 114, for use by the computer 250. The ground 204 for the power supply is shown isolated from the second ground reference 206 for the secondary side of the transformer 214. This second ground reference 206 is also representative for the ground 206 for the microphone preamp, but again is isolated from the computer bus ground 211, i.e., a third ground reference. The computer bus ground reference is also representative for the DSP 112 and the differential amp 227. The ground of the differential amp is the same as that of the DSP 112 in order for the ADC to convert the correct Microphone signal into the digital domain.

Figure 3:
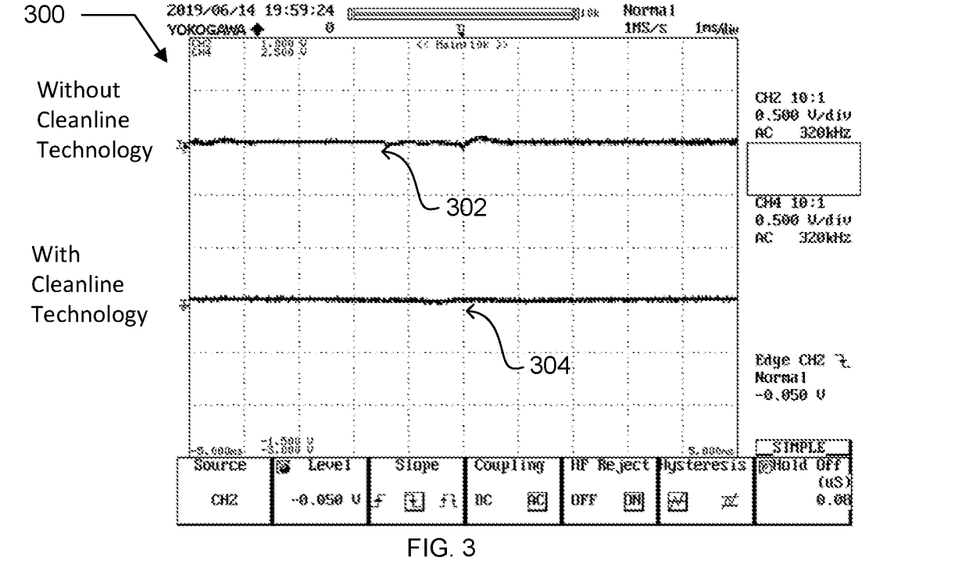
FIG. 3 is a diagram illustrating sample power supply noise reductions in the presence of lightly loaded graphics cards in accordance with some embodiments of the present invention.
Figure 4:
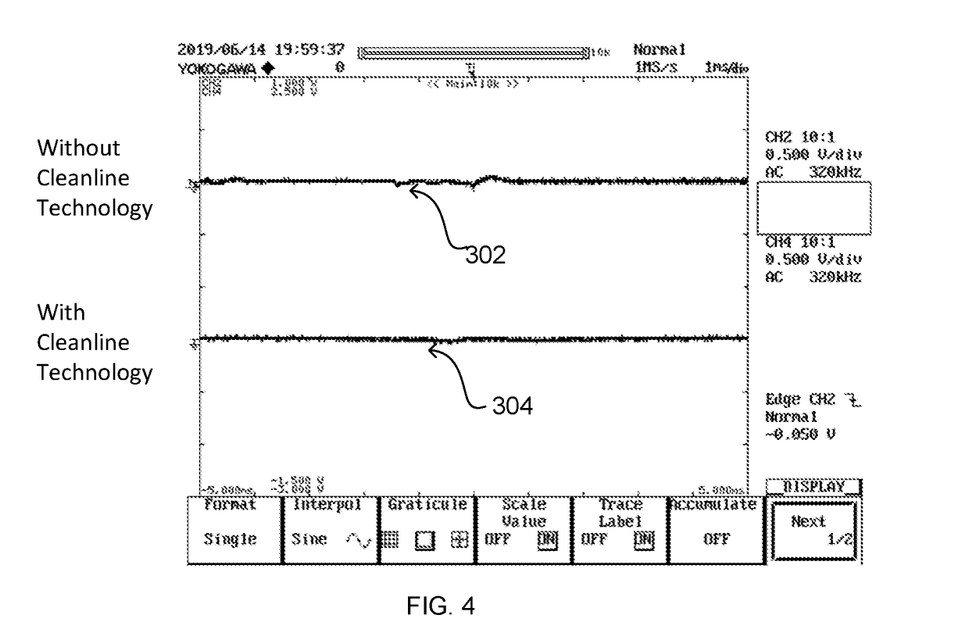
FIG. 4 is a diagram illustrating another view of sample power supply noise reductions in the presence of lightly loaded graphics cards in accordance with some embodiments of the present invention.

FIG. 3 is a diagram illustrating sample power supply noise reductions in the presence of lightly loaded graphics cards in accordance with some embodiments of the present invention. FIG. 4 is a diagram illustrating another view of sample power supply noise reduction in the presence of lightly loaded graphics cards in accordance with some embodiments of the present invention. FIGS. 3 and 4 show sample results of noise improvement present when the graphics card is not running at load. In this case, the noise present is primarily a function of common mode noise. In several embodiments, the sound card inputs and outputs are accessed by an external Audio Control Module (ACM). For example, an ACM can be accessed by an electrical cord, sometimes 6 feet or so in length, and can include a display, mic preamp inputs, and headphone outputs. While providing convenience, this module can lead to increased noise, especially common mode noise. The differential amplifier 227 is well placed to handle this noise.

Although not shown here, the computer audio card such as card 200 will also have audio amplification circuits for regular audio signals, i.e., non-microphone signals. Since the amplification factors for these audio circuits is much less than the 100× (40 dB) described for the microphone preamp, the power supply noise generated as power supply ripple is not problematic and does not need to be isolated.

FIG. 5 is a diagram illustrating sample power supply noise reductions in the presence of heavily loaded graphics cards in accordance with some embodiments of the present invention. FIG. 6 is a diagram illustrating another view of sample power supply noise reductions in the presence of heavily loaded graphics cards in accordance with some embodiments of the present invention. Oscilloscope trace 502 vs. trace 504 in FIG. 5 shows the microphone noise improvements using the isolation blocks of various embodiments of the present invention. In particular, power supply ripple voltage shown as high as 1 volt peak-to-peak is significantly reduced by isolating the 12V power supply voltage provided by the auxiliary power connector (102) from the microphone preamp 208 using isolation block 210. A good estimation for the frequency of the illustrated power supply ripple voltage is in the audio frequency range, here estimated to be at around 1 kHz, but this can vary according to the application.

Various embodiments of the present invention have been described above, typically with an isolation circuit connected to the power supply rails, said circuit including at least a transformer that provides isolation between the power supply and the amplification circuits. It should be noted that the invention is not limited to isolation circuits having transformers. The scope of the invention is intended to further cover any environment where the circuitry in an isolation block isolates the power supply ground from audio amplifier circuit grounds and more particularly from microphone amplifier circuits. In the illustrated embodiment of FIG. 2, the switching network and transformer are used for isolation of grounds without any change in the voltage from input to output. That is, in one embodiment the invention uses the isolation block only for isolation purposes. In other embodiments the switching circuit, transformer, and rectifier block of isolation block 210 are used additionally for voltage conversion. For non-limiting examples, the voltage conversion can be 12V to 12V, 12V to 5V, 5V to 12V, or simply any voltage to any voltage within the component spec.

We substantially eliminate, through the use of our isolation circuit, the audio frequency range ripple to provide a clean output from the microphone preamp and a clean signal to the DSP. The isolation circuit or block uses an isolated switching supply power supply to decouple the power supply to the microphone pre-amplifier. We additionally reduce common mode noise introduced by other sources by applying the microphone signals in a differential drive mode. As a result, various embodiments of the present invention provide a better user experience. The advantages provided by the described noise isolation and reduction features include clear voice communications without the use of an external mixer.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. An audio processing system for use with a computing device, the system comprising:
   an isolation block between a microphone preamp circuit and a power supply of the computing device, the isolation block configured to receive a supply signal comprising a positive voltage and a first ground reference from a power supply connector of the computing device, the isolation block configured to reduce power supply noise present in the supply signal by providing at an output a positive output voltage and a second ground reference, the second ground reference of a microphone preamp circuit being isolated and different from the first ground reference of the power supply, resulting in an isolated low noise power supply to minimize the voltage ripple noise and provide a clean voltage that is applied to the microphone preamp circuit to prevent amplification by the microphone preamp circuit;
   the microphone preamp circuit configured with one input receiving a microphone signal, a second input at the second ground voltage, and an output signal; and
   a digital signal processor block configured to receive the microphone preamp output signal, convert it to a digital format, and to transmit the digitized microphone preamp output signal to a computer bus on the computing device, wherein the computer bus comprises a third ground reference isolated and different from the first ground reference and the second ground reference.

2. The system as recited in claim 1 wherein the computing device is one of a notebook computer or a desktop computer.

3. The system as recited in claim 1 wherein the power supply connector is a PCIe Power Socket and the computer bus is a PCIe bus.

4. The system as recited in claim 1 further comprising a differential amplifier connected between the microphone preamp and the digital signal processor block and wherein the differential amplifier is configured to remove common mode noise from the microphone preamp output signal.

5. The system as recited in claim 4, wherein the differential amplifier is grounded to the third ground reference.

6. The system as recited in claim 1 wherein the isolation block comprises a switching circuit, a rectifier block and a transformer.

7. The system as recited in claim 6 wherein the switching circuit comprises a push-pull configuration.

8. The system as recited in claim 1, wherein the digital signal processor block is grounded to the third ground reference.

9. A method for reducing noise in a microphone circuit comprising the steps of:
   receiving, by an isolation block, a supply signal from a power supply, the supply signal comprising a positive voltage and a first ground reference,
   wherein the isolation block is between a microphone preamp circuit and a power supply of a computing device;
   isolating a low noise power supply from a noisy power supply to reduce power supply noise present in the supply signal by providing at an output a positive output voltage and a second ground reference of the microphone preamp circuit, the second ground reference being isolated and different from the first ground reference of the power supply to minimize the voltage ripple noise and provide a clean voltage that is applied to the microphone preamp circuit to prevent amplification by the microphone preamp circuit;
   configuring the microphone circuit to receive power from the low noise power supply; and
   configuring a digital signal processor block to receive a microphone preamp output signal from the microphone preamp circuit, to convert the microphone preamp output signal to a digital format, and to transmit the digitized microphone preamp output signal to a computer bus on the computing device,
   wherein the computer bus comprises a third ground reference isolated and different from the first ground reference and the second ground reference, and the digital signal processor block is grounded to the third ground reference.

10. The method as recited in claim 9 wherein the isolating the low noise power supply comprises isolating with a switching circuit and a transformer.

11. The method as recited in claim 10 further comprising applying the microphone microphone preamp output signal to a differential amplifier to reduce common mode noise, and the differential amplifier is grounded to the third ground reference.

12. A computer audio card for coupling to a computing device, comprising:
   an auxiliary power socket configured to receive an auxiliary power connector supplying supplemental power from the computing device power supply;
   a microphone preamplifier configured to receive a microphone signal and amplifying it before transmission to an analog to digital converter (ADC);
   an isolation block between the microphone preamplifier and a power supply, the isolation block configured for conditioning the supplemental power by isolating the supplemental power from power delivered to the microphone preamplifier, the isolation block further configured to receive a supply signal comprising a positive voltage and a first ground reference, the isolation block configured to reduce power supply noise present in the supply signal by providing at an output a positive output voltage and second ground reference, the second ground reference of a microphone preamplifier being isolated and different from the first ground reference of the power supply, resulting in an isolated low noise power supply to minimize the voltage ripple noise and provide a clean voltage that is applied to the microphone preamplifer to prevent amplification by the microphone preamplifer; and a digital signal processing block configured for receiving a digital signal from the ADC, processing the digital signal, the digital signal processing block is further configured to transmit the processed digital signal to a computer bus coupled to the computing device, the computer bus comprises a third ground reference isolated and different from the first ground reference and the second ground reference, and the digital signal processor block is grounded to the third ground reference.

13. The computer audio card recited in claim 12 further comprising a microphone differential amplifier connected between the microphone preamplifier and the ADC in a microphone path for removing common mode noise.

14. The computer audio card recited in claim 13 wherein the microphone amplifier is connectable to a microphone via an input jack.

15. The computer audio card recited in claim 14 wherein the microphone input jack is located on an external audio control module.

16. The computer audio card recited in claim 13, wherein the microphone differential amplifier is configured to receive a differential microphone signal from the microphone pre-amplifer and configured to transmit a noise reduced output signal to the ADC.

17. The computer audio card recited in claim 16, wherein the microphone differential amplifier is grounded to the third ground reference.

18. The computer audio card recited in claim 12 wherein the computing device is a desktop computer, the computer bus is a PCI Express bus, the auxiliary power connector is an auxiliary PCIe power connector, and the auxiliary power socket is configured to receive the auxiliary PCI Express power connector.

* * * * *